United States Patent
Nakano et al.

(10) Patent No.: US 9,614,099 B2
(45) Date of Patent: Apr. 4, 2017

(54) SEMICONDUCTOR DEVICE AND IMAGING DEVICE

(71) Applicant: Kabushiki Kaisha Toshiba, Minato-ku (JP)

(72) Inventors: Shintaro Nakano, Kawasaki (JP); Tomomasa Ueda, Yokohama (JP); Kentaro Miura, Kawasaki (JP); Nobuyoshi Saito, Oota (JP); Tatsunori Sakano, Kawasaki (JP); Yuya Maeda, Kawasaki (JP); Masaki Atsuta, Yokosuka (JP); Hajime Yamaguchi, Kawasaki (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 176 days.

(21) Appl. No.: 14/455,168

(22) Filed: Aug. 8, 2014

(65) Prior Publication Data

US 2015/0084040 A1   Mar. 26, 2015

(30) Foreign Application Priority Data

Sep. 24, 2013   (JP) ................................ 2013-196706

(51) Int. Cl.
  *H01L 29/786*   (2006.01)
  *H01L 27/146*   (2006.01)
  *H01L 27/12*   (2006.01)

(52) U.S. Cl.
  CPC ...... *H01L 29/7869* (2013.01); *H01L 27/1225* (2013.01); *H01L 27/14603* (2013.01);
  (Continued)

(58) Field of Classification Search
  None
  See application file for complete search history.

(56) References Cited

U.S. PATENT DOCUMENTS

| | | |
|---|---|---|
| 2010/0148171 A1 | 6/2010 | Hayashi et al. |
| 2011/0309353 A1 | 12/2011 | Kaneko et al. |

(Continued)

FOREIGN PATENT DOCUMENTS

| | | |
|---|---|---|
| JP | 9-205214 A | 8/1997 |
| JP | 11-24105 A | 1/1999 |

(Continued)

*Primary Examiner* — Kimberly Rizkallah
*Assistant Examiner* — Bo Bin Jang
(74) *Attorney, Agent, or Firm* — Oblon, McClelland, Maier & Neustadt, L.L.P.

(57) ABSTRACT

According to one embodiment, a semiconductor device includes a semiconductor layer including a first semiconductor portion and a second semiconductor portion being continuous with the first semiconductor portion, a first gate electrode, a second gate electrode, an insulating film. The first semiconductor portion includes a first portion, a second portion and a third portion provided between the first portion and the second portion. The second semiconductor portion includes a fourth portion separated from the first portion, a fifth portion separated from the second portion, and a sixth portion provided between the forth portion and the fifth portion. The first gate electrode is separated from the third portion. The second gate electrode is separated from the sixth portion. The insulating film is provided at a first position between the first gate electrode and the semiconductor layer and at a second position between the second gate electrode and the semiconductor layer.

18 Claims, 7 Drawing Sheets

(52) U.S. Cl.
CPC .. *H01L 27/14632* (2013.01); *H01L 29/78636* (2013.01); *H01L 29/78648* (2013.01); *H01L 29/78693* (2013.01); *H01L 27/14643* (2013.01)

(56) References Cited

U.S. PATENT DOCUMENTS

| | | |
|---|---|---|
| 2011/0309411 A1 | 12/2011 | Takemura |
| 2013/0037795 A1* | 2/2013 | Sunamura ........... H01L 23/4824 257/43 |
| 2013/0153887 A1* | 6/2013 | Kaneko ................. H01L 27/088 257/43 |

FOREIGN PATENT DOCUMENTS

| | | |
|---|---|---|
| JP | 2004-103957 | 4/2004 |
| JP | 2007-318110 A | 12/2007 |
| JP | 2010-141230 | 6/2010 |
| JP | 2012-19092 A | 1/2012 |
| JP | 2012-23352 | 2/2012 |
| JP | 2012-28731 | 2/2012 |
| JP | 2012-80096 A | 4/2012 |
| JP | 2013-125826 A | 6/2013 |

\* cited by examiner

SEMICONDUCTOR DEVICE AND IMAGING DEVICE

CROSS-REFERENCE TO RELATED APPLICATIONS

This application is based upon and claims the benefit of priority from Japanese Patent Application No. 2013-196706, filed on Sep. 24, 2013; the entire contents of which are incorporated herein by reference.

FIELD

Embodiments described herein relate generally to a semiconductor device and imaging device.

BACKGROUND

There are semiconductor devices that use thin film transistors. There are imaging devices that use thin film transistors. It is desirable to suppress fluctuation of the characteristics in such semiconductor devices and imaging devices.

DETAILED DESCRIPTION

Figure 1:
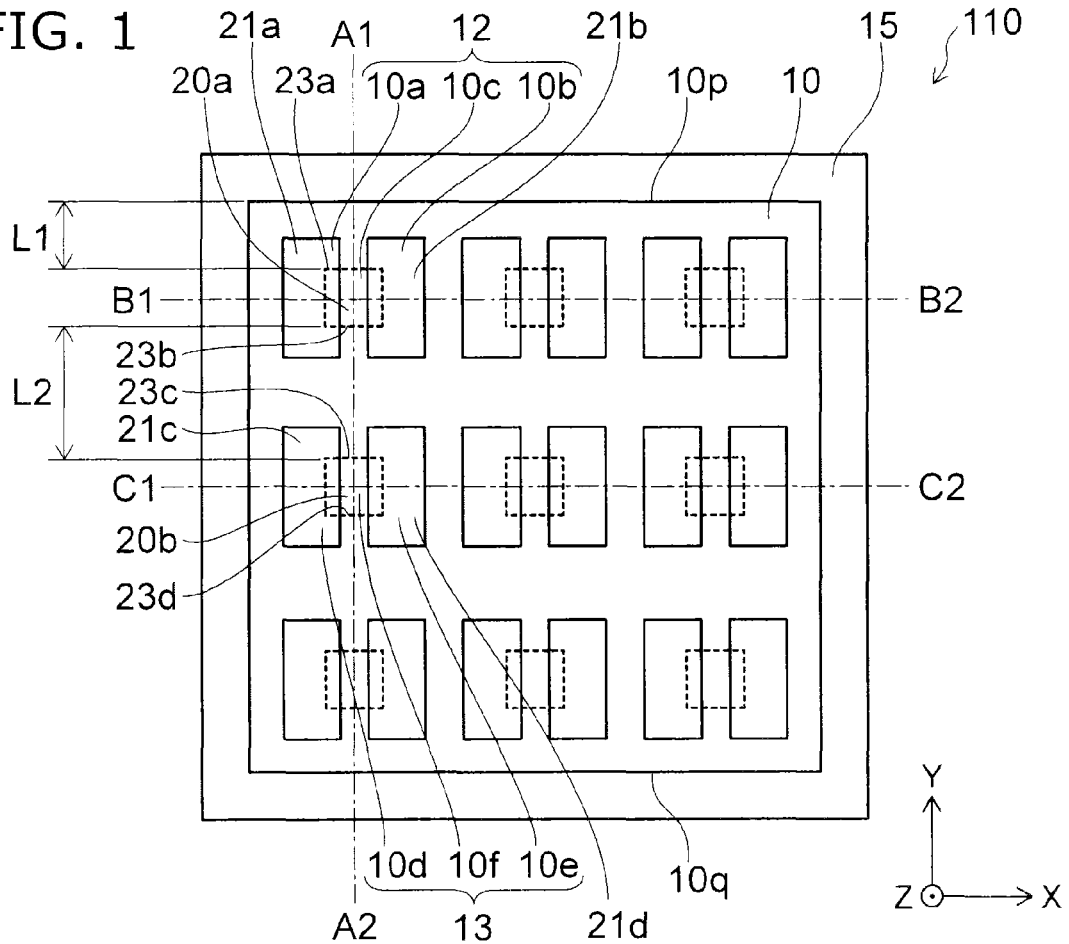
FIG. 1 is a perspective plan view illustrating a semiconductor device according to the first embodiment.

According to one embodiment, a semiconductor device includes a semiconductor layer, a first gate electrode, a second gate electrode, an insulating film, a first electrode, a second electrode, a third electrode, and a fourth electrode. The semiconductor layer includes a first semiconductor portion and a second semiconductor portion being continuous with the first semiconductor portion. The first semiconductor portion includes a first portion, a second portion separated from the first portion in a first direction, and a third portion provided between the first portion and the second portion. The second semiconductor portion includes a fourth portion, a fifth portion, and a sixth portion. The fourth portion is separated from the first portion in a second direction intersecting the first direction. The fifth portion is separated from the second portion in the second direction. The sixth portion is provided between the fourth portion and the fifth portion. The first gate electrode is provided to be separated from the third portion in a third direction intersecting a plane including the first direction and the second direction. The second gate electrode is provided to be separated from the sixth portion in the third direction and separated from the first gate electrode in the second direction. The insulating film is provided at a first position between the first gate electrode and the semiconductor layer and at a second position between the second gate electrode and the semiconductor layer. The first electrode is provided to be separated from the first gate electrode, separated from the second gate electrode, and electrically connected to the first portion. The second electrode is provided to be separated from the first gate electrode, separated from the second gate electrode, separated from the first electrode, and electrically connected to the second portion. The third electrode is provided to be separated from the first gate electrode, separated from the second gate electrode, separated from the first electrode, separated from the second electrode, and electrically connected to the fourth portion. The fourth electrode is provided to be separated from the first gate electrode, separated from the second gate electrode, separated from the first electrode, separated from the second electrode, separated from the third electrode, and electrically connected to the fifth portion.

Various embodiments will be described hereinafter with reference to the accompanying drawings.

The drawings are schematic or conceptual; and the relationships between the thicknesses and widths of portions, the proportions of sizes between portions, etc., are not necessarily the same as the actual values thereof. Further, the dimensions and/or the proportions may be illustrated differently between the drawings, even for identical portions.

In the drawings and the specification of the application, components similar to those described in regard to a drawing thereinabove are marked with like reference numerals, and a detailed description is omitted as appropriate.

First Embodiment

FIG. 1 is a perspective plan view illustrating a semiconductor device according to the first embodiment.

Figure 2:
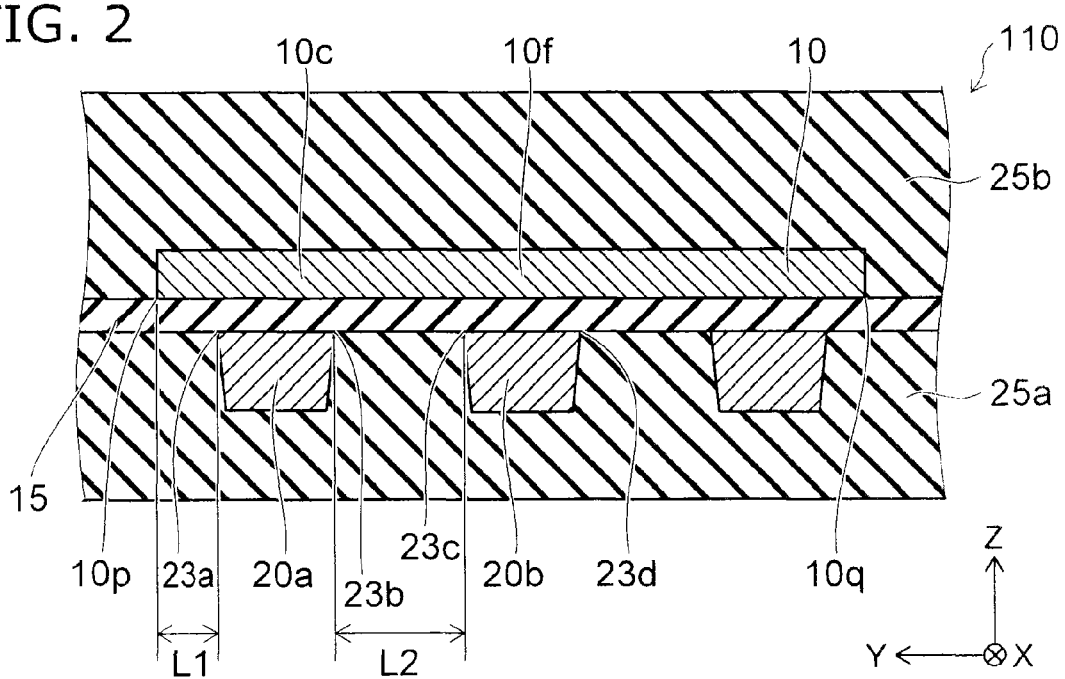
FIG. 2 is a schematic cross-sectional view illustrating the semiconductor device according to the first embodiment.

FIG. 2 is a schematic cross-sectional view illustrating the semiconductor device according to the first embodiment.

Figure 3A:
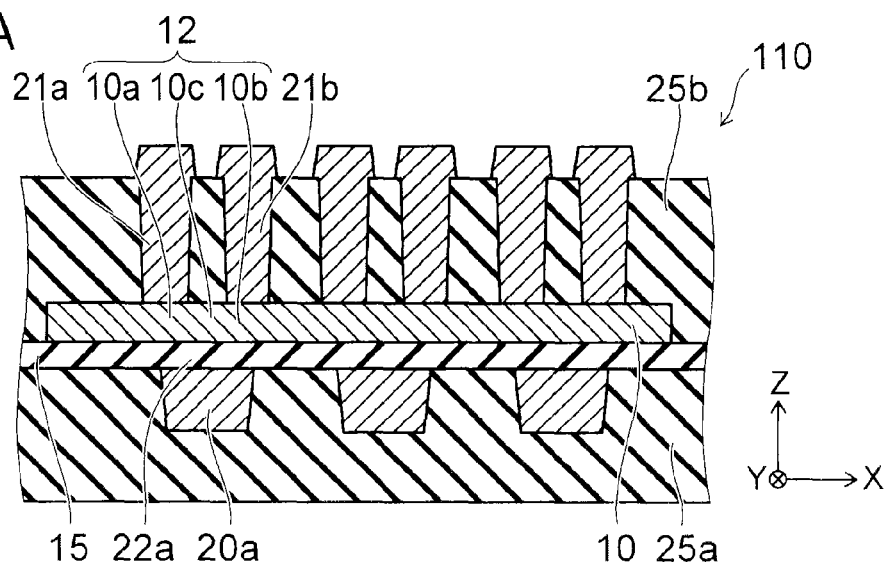
FIG. 3A to FIG. 3C are schematic cross-sectional views illustrating the semiconductor device according to the first embodiment.
Figure 3B:
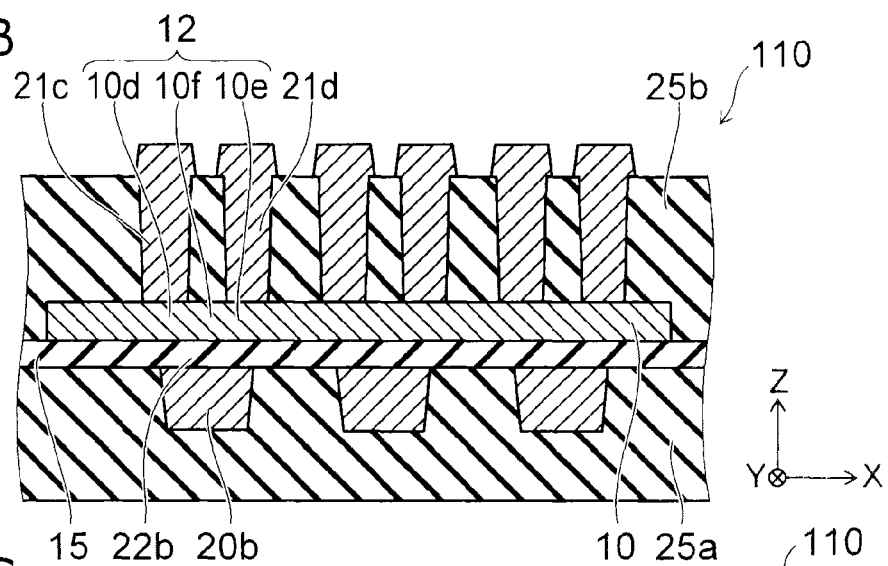
Figure 3C:
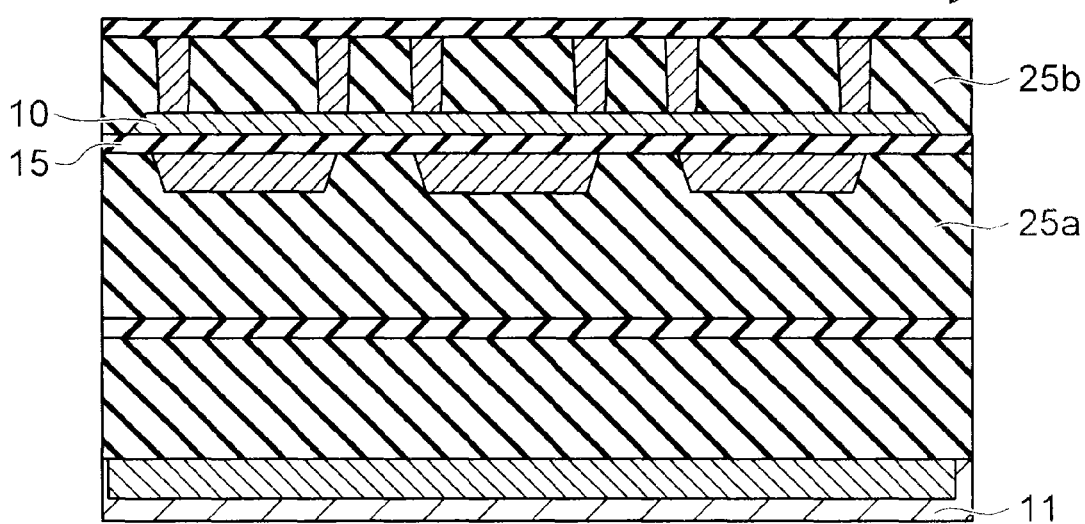

FIG. 3A to FIG. 3C are schematic cross-sectional views illustrating the semiconductor device according to the first embodiment.

FIG. 2 is a cross-sectional view along line A1-A2 of FIG. 1. FIG. 3A is a cross-sectional view along line B1-B2 of FIG. 1. FIG. 3B is a cross-sectional view along line C1-C2 of FIG. 1.

As shown in FIG. 1, the semiconductor device 110 according to the first embodiment includes a semiconductor layer 10, a first gate electrode 20a, and a second gate electrode 20b.

The semiconductor layer 10 includes a first semiconductor portion 12 and a second semiconductor portion 13. The first semiconductor portion 12 includes a first portion 10a, a second portion 10b, and a third portion 10c. The second semiconductor portion 13 includes a fourth portion 10d, a fifth portion 10e, and a sixth portion 10f. The first semiconductor portion 12 and the second semiconductor portion 13 are provided to be continuous.

A first direction from the first portion 10a toward the second portion 10b is taken as an X-axis direction. One direction perpendicular to the X-axis direction is taken as a Z-axis direction. A direction perpendicular to the X-axis direction and the Z-axis direction is taken as a Y-axis direction.

The third portion 10c is provided between the first portion 10a and the second portion 10b. The fourth portion 10d is separated from the first portion 10a in a second direction (e.g., the Y-axis direction) intersecting the X-axis direction. The fifth portion 10e is separated from the second portion 10b in the second direction (e.g., the Y-axis direction) intersecting the X-axis direction. The sixth portion 10f is provided between the fourth portion 10d and the fifth portion 10e.

When projected onto the X-Y plane, the first gate electrode 20a overlaps at least a portion of the third portion 10c. When projected onto the X-Y plane, the second gate electrode 20b overlaps at least a portion of the sixth portion 10f.

The semiconductor layer 10 has a first semiconductor side 10p and a second semiconductor side 10q. The second semiconductor side 10q is separated from the first semiconductor side 10p in the Y-axis direction.

The first gate electrode 20a has a first gate side 23a and a second gate side 23b. The second gate side 23b is provided between the second semiconductor side 10q and the first gate side 23a when projected onto the X-Y plane.

The second gate electrode 20b has a third gate side 23c and a fourth gate side 23d. The fourth gate side 23d is provided between the second semiconductor side 10q and the third gate side 23c when projected onto the X-Y plane.

A first distance L1 is the distance along the Y-axis direction between the first semiconductor side 10p and the first gate side 23a. A second distance L2 is the distance along the Y-axis direction between the second gate side 23b and the third gate side 23c. For example, the first distance L1 is 0.3 μm (micrometers) or more. For example, the second distance L2 is 0.5 μm or more.

As shown in FIG. 2, the first gate electrode 20a is separated from the third portion 10c in a direction (e.g., the Z-axis direction) intersecting the X-Y plane. The second gate electrode 20b is separated from the sixth portion 10f in a direction (e.g., the Z-axis direction) intersecting the X-Y plane.

The semiconductor device 110 includes an insulating film 15. The insulating film 15 is provided at a first position between the third portion 10c and the first gate electrode 20a and at a second position between the sixth portion 10f and the second gate electrode 20b. In other words, the insulating film 15 has a first position provided between the third portion 10c and the first gate electrode 20a and a second position provided between the sixth portion 10f and the second gate electrode 20b.

The semiconductor device 110 includes a first electrode 21a, a second electrode 21b, a third electrode 21c, and a fourth electrode 21d.

As shown in FIG. 3A, the first electrode 21a is electrically connected to the first portion 10a of the semiconductor layer 10. The second electrode 21b is electrically connected to the second portion 10b of the semiconductor layer 10.

As shown in FIG. 3B, the third electrode 21c is electrically connected to the fourth portion 10d of the semiconductor layer 10. The fourth electrode 21d is electrically connected to the fifth portion 10e of the semiconductor layer 10. The first gate electrode 20a, the second gate electrode 20b, the first electrode 21a, the second electrode 21b, the third electrode 21c, and the fourth electrode 21d are separated from each other.

As shown in FIG. 3A and FIG. 3B, the semiconductor device 110 according to the first embodiment includes multiple thin film transistors. For example, the semiconductor device 110 includes a first transistor 22a and a second transistor 22b. The first transistor 22a includes the first semiconductor portion 12, the first gate electrode 20a, the first electrode 21a, and the second electrode 21b. The second transistor 22b includes the second semiconductor portion 13, the second gate electrode 20b, the third electrode 21c, and the fourth electrode 21d. The first semiconductor portion 12 and the second semiconductor portion 13 are provided to be continuous. The first transistor 22a and the second transistor 22b include one semiconductor layer 10 that is provided to be continuous. The first transistor 22a and the second transistor 22b share the semiconductor layer 10.

The insulating film 15 functions as a gate insulator film in the first transistor 22a and the second transistor 22b.

The first electrode 21a is, for example, a source electrode of the first transistor 22a. The second electrode 21b is, for example, a drain electrode of the first transistor 22a.

The third electrode 21c is, for example, a source electrode of the second transistor 22b. The fourth electrode 21d is, for example, a drain electrode of the second transistor 22b.

The first gate electrode 20a and the second gate electrode 20b include, for example, Cu (copper). The insulating film 15 includes, for example, a silicon nitride film. The insulating film 15 may have a stacked structure. For example, a silicon oxide film or a high-k film may be stacked on the silicon nitride film as the stacked structure. For example, an aluminum oxide film, a tantalum oxide film, a hafnium oxide film, a titanium oxide film, or the like is used as the high-k film.

The semiconductor layer 10 includes, for example, an oxide including oxygen, In (indium), and at least one selected from Ga (gallium) and Zn (zinc). The semiconductor layer 10 includes, for example, an amorphous oxide semiconductor such as In—Ga—Zn—O (hereinbelow, called InGaZnO), etc. InGaZnO is formed as a film by, for example, sputtering. InGaZnO is formed uniformly as a film over a wide surface area at room temperature. Thereby, a thin film transistor can be formed at a relatively low temperature of, for example, about 300° C. to 400° C. A thin film transistor having high reliability and small fluctuation can be formed. The mobility due to the field effect of the carriers of InGaZnO is about 10 times the mobility due to the field effect of the carriers of amorphous silicon. Thereby, good characteristics can be obtained.

The first electrode, the second electrode, the third electrode, and the fourth electrode include, for example, at least one selected from Mo (molybdenum), Ti (titanium), Al (aluminum), ITO (indium tin oxide), IZO (indium zinc oxide), TiN (titanium nitride), TaN (tantalum nitride), and Mo$_2$N (molybdenum nitride).

The semiconductor device 110 includes multiple transistors. The multiple transistors include one semiconductor layer 10 that is provided to be continuous. The multiple transistors share the semiconductor layer 10. The semiconductor device 110 according to the embodiment may include two or more thin film transistors.

FIG. 3C is a schematic cross-sectional view of the semiconductor device 110 according to the first embodiment. For example, the semiconductor layer 10 is provided between a first inter-layer insulating film 25a and a second inter-layer insulating film 25b. The first inter-layer insulating film 25a is provided between a semiconductor substrate 11 and the semiconductor layer 10. In other words, the thin film transistors according to the embodiment are provided in the interconnect layer of a CMOS process.

The thin film transistors according to the embodiment may be included in, for example, CMOS image sensors. The downscaling of CMOS image sensors is advancing. The light reception surface area of photodiodes is decreasing;

and there are cases where the S/N ratio is small. The light reception surface area of the photodiodes is reduced in the case where amplifier transistors and/or reset transistors are provided on Si which is the substrate. The thin film transistors according to the embodiment are provided in the interconnect layer. Thereby, for example, the light reception surface area of the photodiodes can be increased.

In the case where the thin film transistors are provided in the interconnect layer, the process may fluctuate in the pattern formation of the semiconductor layer 10. Thereby, the characteristics of the thin film transistors may fluctuate. In the semiconductor device 110 according to the embodiment, the multiple transistors include one semiconductor layer 10 that is provided to be continuous. The multiple transistors are provided in one semiconductor layer 10 that is provided to be continuous. Thereby, for example, fine pattern formation of the semiconductor layer 10 can be avoided. The fluctuation of the process in the pattern formation of the semiconductor layer 10 can be suppressed. The fluctuation of the characteristics of the thin film transistors can be suppressed. According to the embodiment, a semiconductor device is provided in which the fluctuation of the characteristics is suppressed.

In the semiconductor device 110, InGaZnO is used as the semiconductor layer 10. The thickness of the InGaZnO is, for example, not less than 5 nm and not more than 100 nm. It is favorable for the thickness to be not less than 10 nm and not more than 50 nm. In such a case, the first distance L1 is, for example, 0.3 μm or more.

Figure 4:
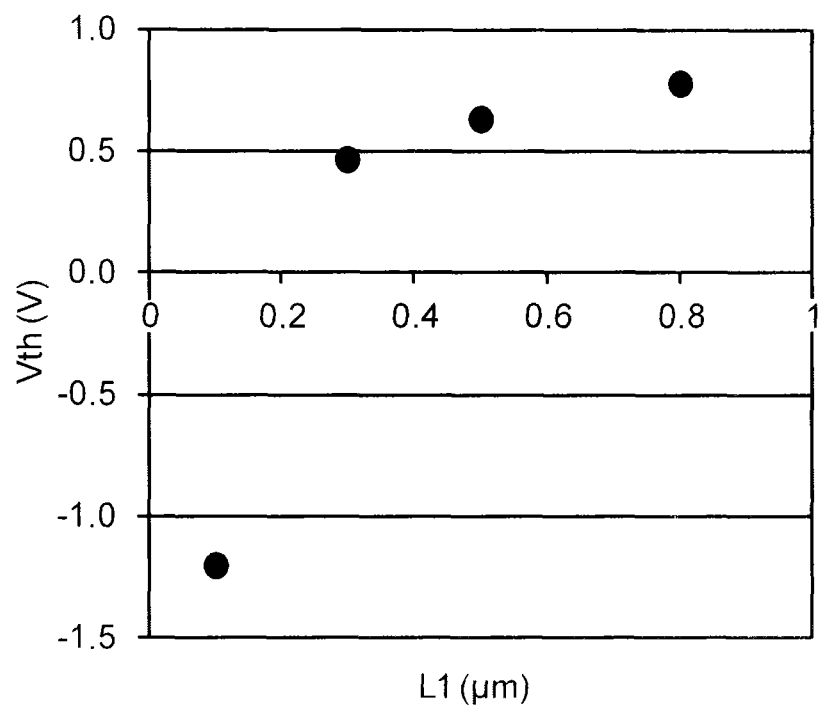
FIG. 4 is a graph illustrating a characteristic of the semiconductor device according to the first embodiment.

FIG. 4 is a graph illustrating a characteristic of the semiconductor device according to the first embodiment.

FIG. 4 shows a characteristic of the first transistor 22a. The vertical axis of FIG. 4 is a threshold Vth of the first transistor 22a. The horizontal axis of FIG. 4 is the first distance L1. The threshold Vth has a large shift to the negative side when the first distance L1 is less than 0.3 μm. This is because, for example, the resistance of the semiconductor layer 10 is low at the end of the semiconductor layer 10. There are cases where the resistance of the semiconductor layer 10 is reduced when patterning the semiconductor layer 10 by etching, etc. In the semiconductor device 110 according to the embodiment, the first distance L1 is, for example, 0.3 μm or more.

The distance along the second direction between the first semiconductor side 10p and the first electrode 21a is, for example, 0.24 μm or more and is, for example, 0.8 times the first distance L1 or more. Thereby, for example, the fluctuation of the characteristics of the transistors due to the fluctuation of the resistance of the semiconductor layer 10 can be suppressed.

The second distance L2 is, for example, 0.5 μm or more.

Figure 5:
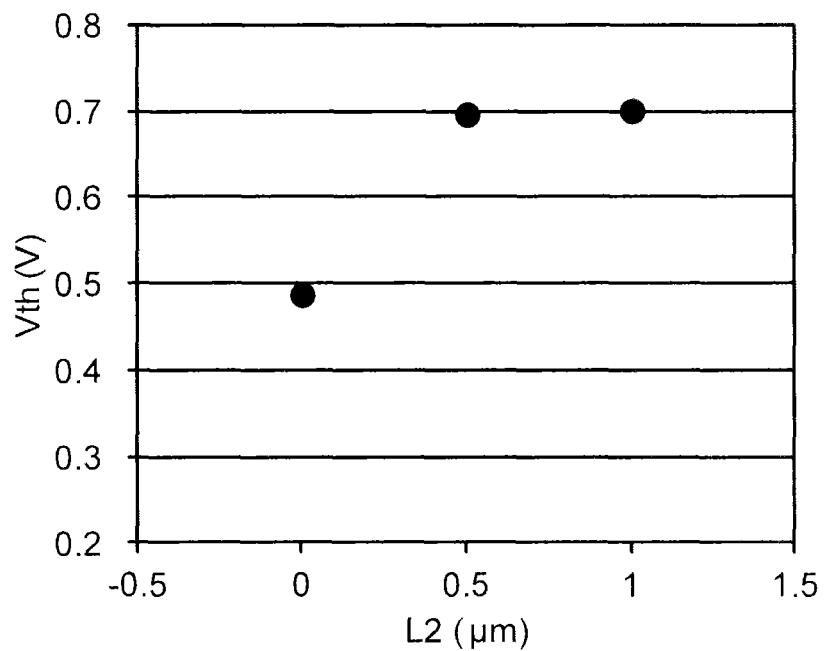
FIG. 5 is a graph illustrating a characteristic of the semiconductor device according to the first embodiment.

FIG. 5 is a graph illustrating a characteristic of the semiconductor device according to the first embodiment.

FIG. 5 shows a characteristic of the first transistor 22a. The vertical axis of FIG. 5 is the threshold Vth of the first transistor 22a. The horizontal axis of FIG. 5 is the second distance L2. The threshold Vth has a large shift when the second distance L2 is less than 0.5 μm. This is because the oxygen that is included inside the semiconductor layer 10 is absorbed by the electrodes when performing, for example, heat treatment in the formation process of the semiconductor device 110. In the semiconductor device 110 according to the embodiment, the second distance L2 is, for example, 0.5 μm or more. Thereby, for example, the effect of the contact holes of the source/drain electrodes on the semiconductor layer does not interfere with the adjacent channel portion.

The distance along the second direction (the Y-axis direction) between the first electrode 21a and the third electrode 21c is, for example, 0.4 μm or more, e.g., 0.8 times the second distance L2 or more. Thereby, for example, the effect on the adjacent channel portion in the formation of the source/drain electrodes can be suppressed. The occurrence of the fluctuation of the characteristics of the transistors can be suppressed.

According to the embodiment, a thin film transistor is provided in which the fluctuation is suppressed.

An example of a method for manufacturing the semiconductor device 110 will now be described.

FIG. 6A to FIG. 6E are schematic cross-sectional views illustrating manufacturing processes of the semiconductor device according to the first embodiment.

The thin film transistor is provided in, for example, the interconnect layer of a CMOS process.

Figure 6A:
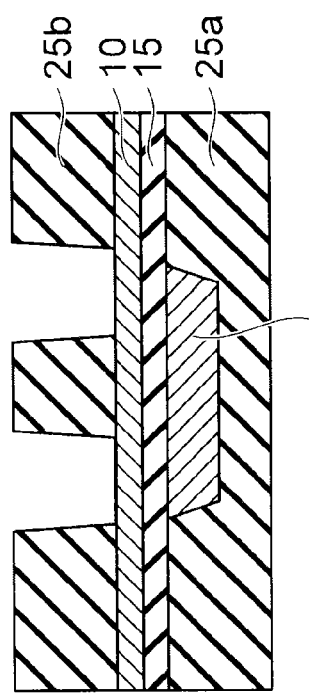
FIG. 6A to FIG. 6E are schematic cross-sectional views illustrating manufacturing processes of the semiconductor device according to the first embodiment.

As shown in FIG. 6A, the first gate electrode 20a is provided in the first inter-layer insulating film 25a by, for example, a damascene process. The formation of the first gate electrode 20a may be performed simultaneously with the interconnect formation process of the CMOS process. The first inter-layer insulating film 25a is, for example, a silicon oxide film. The first gate electrode 20a includes, for example, Cu. The insulating film 15 is provided on the first inter-layer insulating film 25a and on the first gate electrode. The insulating film 15 may include, for example, an etching stopper layer for the interconnect layer formation.

Figure 6B:
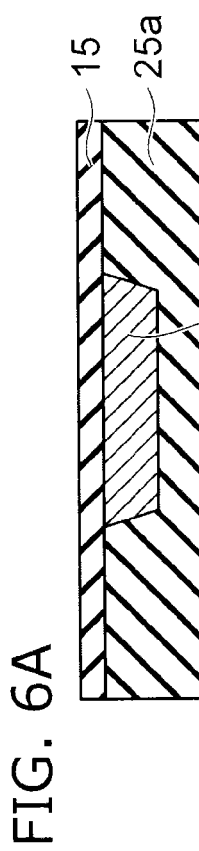

As shown in FIG. 6B, the semiconductor layer 10 is provided on the insulating film 15. In the example, the first gate electrode 20a is provided between the first inter-layer insulating film 25a and the semiconductor layer 10. The semiconductor layer 10 is, for example, InGaZnO. The InGaZnO is formed as a film by, for example, reactive sputtering. The film formation is performed inside a gas mixture of argon and oxygen. The proportion of the amount of the argon and the amount of the oxygen inside the gas is adjusted. Thereby, for example, the carrier density inside the InGaZnO can be controlled. For example, the semiconductor layer 10 is formed by PLD, reactive sputtering, CVD, or spin coating. The semiconductor layer 10 has, for example, an oxide structure. The semiconductor layer 10 has, for example, a multilayered structure. The structure of the semiconductor layer 10 is confirmed by, for example, TEM.

After the film formation of the semiconductor layer 10, the semiconductor layer 10 may be patterned by etching. The insulating film 15 functions as an etching stopper in the process of patterning the semiconductor layer 10. When dry etching is used, there are cases where the difference between the etching rate of the semiconductor layer 10 and the etching rate of the insulating film 15 is small. There are cases where the insulating film 15 is etched excessively. Thereby, defects such as leaks, etc., may occur in the thin film transistor. It is desirable for wet etching to be used as the etching. Thereby, for example, excessive etching of the insulating film 15 is suppressed. The semiconductor layer 10 may not be patterned. Thereby, the excessive etching of the insulating film 15 does not occur.

Figure 6C:
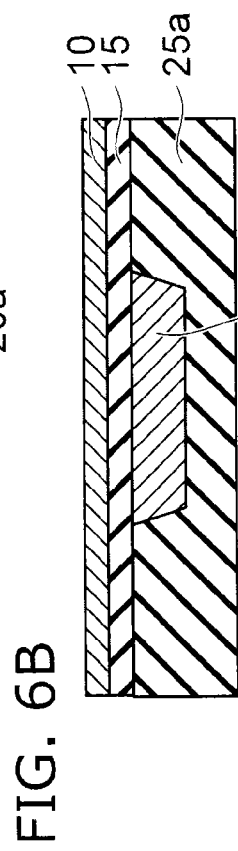

As shown in FIG. 6C, the second inter-layer insulating film 25b is formed on the semiconductor layer 10. The second inter-layer insulating film 25b is, for example, a silicon oxide film. The second inter-layer insulating film 25b is formed by, for example, PECVD. The formation is performed inside a gas mixture of silane and nitrous oxide. As another method, the formation may be performed inside a gas mixture of TEOS and $O_2$ by PECVD. Or, a stacked structure may be used in which one oxide film is formed on the side contacting the semiconductor layer inside a gas mixture of silane and nitrous oxide and an oxide film is formed on the one oxide film inside a gas mixture of TEOS and $O_2$.

The film formation of the second inter-layer insulating film 25b is performed at, for example, 200° C. to 300° C. and favorably at 230° C. to 270° C.

Subsequently, heat treatment is performed inside a clean oven or inside a quartz furnace. The temperature of the heat treatment is, for example, 300° C. to 500° C. It is favorable for the temperature to be 350° C. to 450° C. Ambient air or a nitrogen atmosphere is used as the atmosphere of the heat treatment.

Figure 6D:
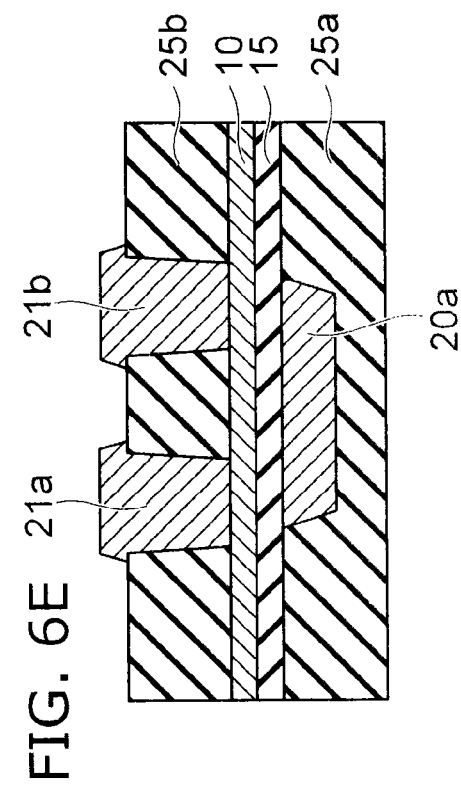

As shown in FIG. 6D, openings are made in the second inter-layer insulating film 25b by, for example, reactive ion etching. A portion of the semiconductor layer 10 is exposed. For example, a carbon tetrafluoride atmosphere is used as the atmosphere of the reactive ion etching.

Figure 6E:
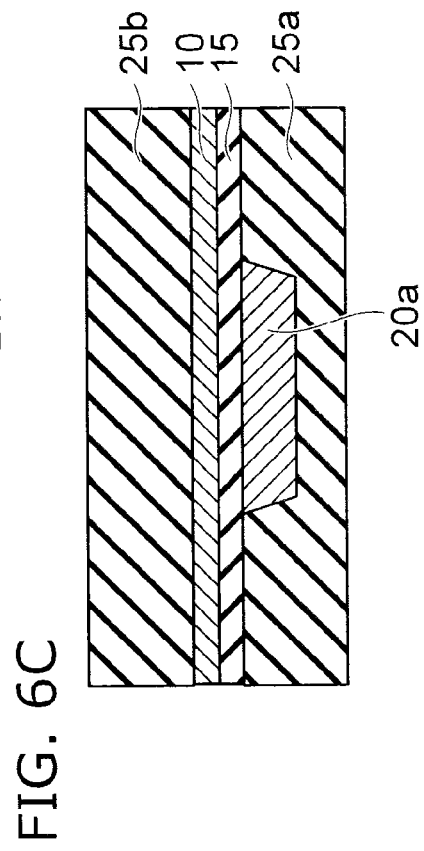

As shown in FIG. 6E, a metal film that is used to form the first electrode 21a and the second electrode 21b is formed. The film formation includes, for example, magnetron sputtering. The metal film includes, for example, Mo, Ti, Al, ITO, IZO, TiN, TaN, $Mo_2N$, etc. After the formation of the metal film, the electrodes are patterned by inductive reactive ion etching.

Subsequently, heat treatment is performed inside a clean oven or inside a quartz furnace. The temperature of the heat treatment is, for example, 300° C. to 500° C. It is favorable for the temperature to be 350° C. to 450° C. Ambient air or a nitrogen atmosphere is used as the atmosphere of the heat treatment.

In FIG. 6A to FIG. 6E, the case where only one gate electrode is included is shown for easier viewing. The semiconductor device 110 according to the first embodiment includes multiple gate electrodes.

According to the embodiment, a thin film transistor is provided in which the fluctuation is suppressed.

Second Embodiment

Figure 7A:
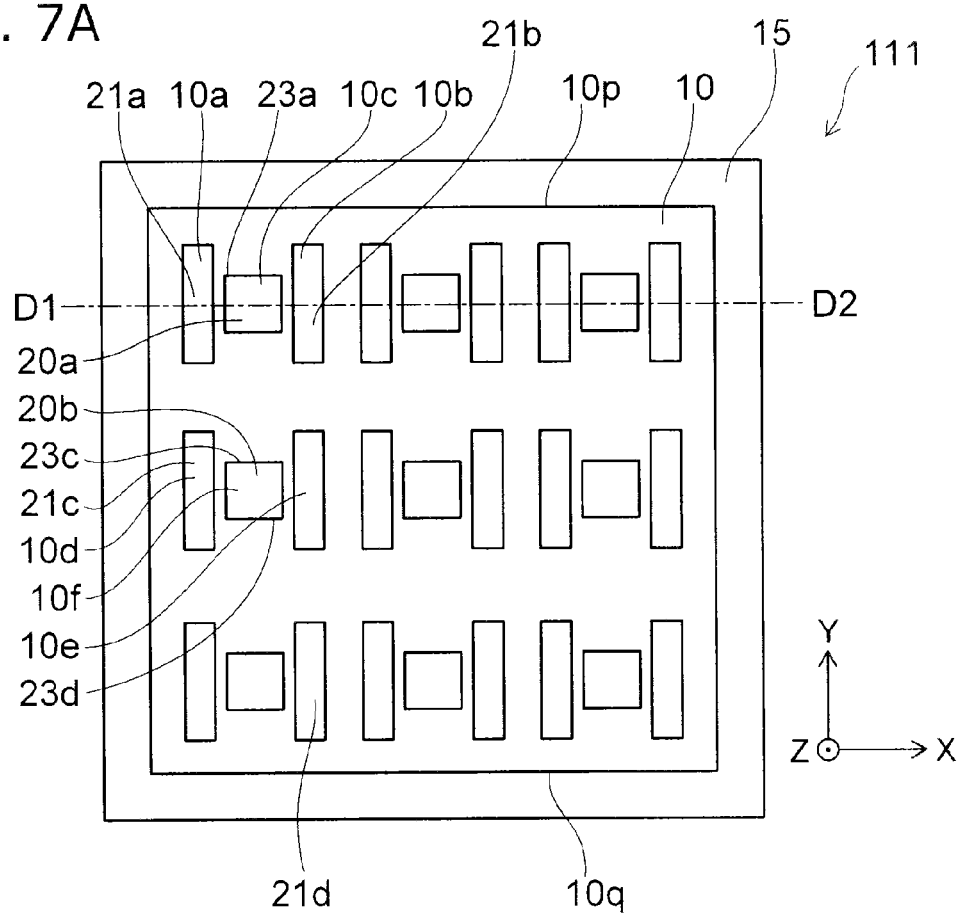
FIG. 7A and FIG. 7B are schematic views illustrating a semiconductor device according to a second embodiment.
Figure 7B:
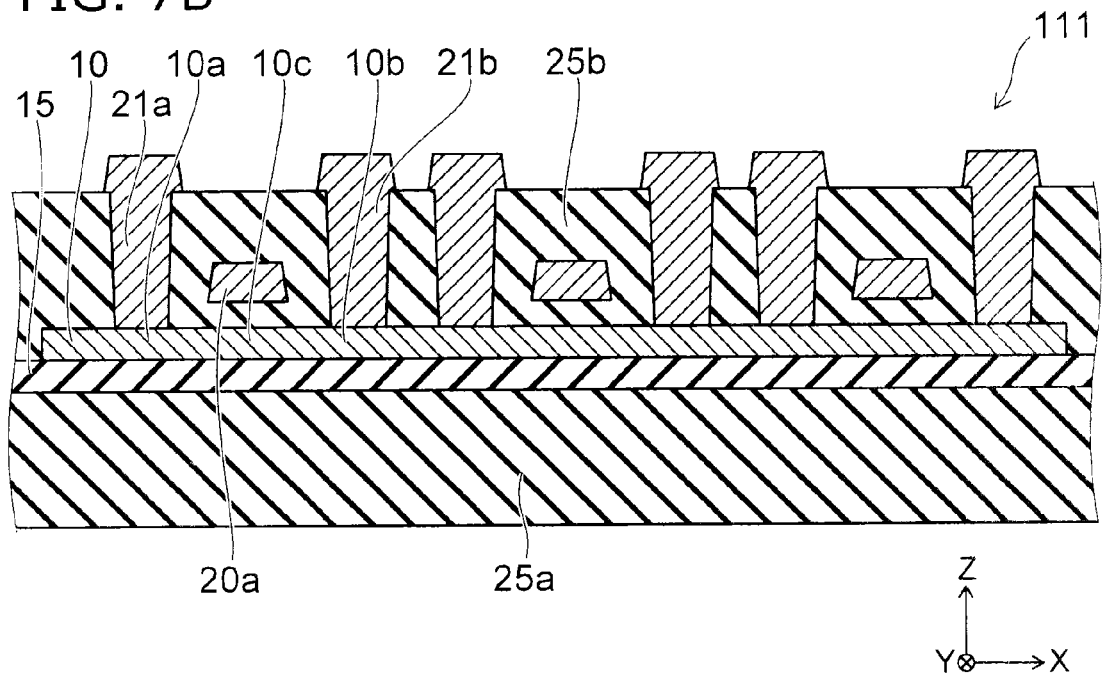

FIG. 7A and FIG. 7B are schematic views illustrating a semiconductor device according to a second embodiment.

FIG. 7A is a perspective plan view showing the semiconductor device according to the second embodiment.

FIG. 7B is a schematic cross-sectional view showing the semiconductor device according to the second embodiment. FIG. 7B is a cross-sectional view along line D1-D2 of FIG. 7A.

In the semiconductor device 111, the first gate electrode 20a and the second gate electrode 20b are provided on the semiconductor layer 10. The first gate electrode 20a is provided between the first electrode 21a and the second electrode 21b. The second gate electrode 20b is provided between the third electrode 21c and the fourth electrode 21d. For example, the second inter-layer insulating film 25b that is between the semiconductor layer 10 and the first gate electrode 20a functions as a gate insulator film. Otherwise, the configuration, the material, etc., are similar to those of the semiconductor device 110 according to the first embodiment.

Figure 8A:
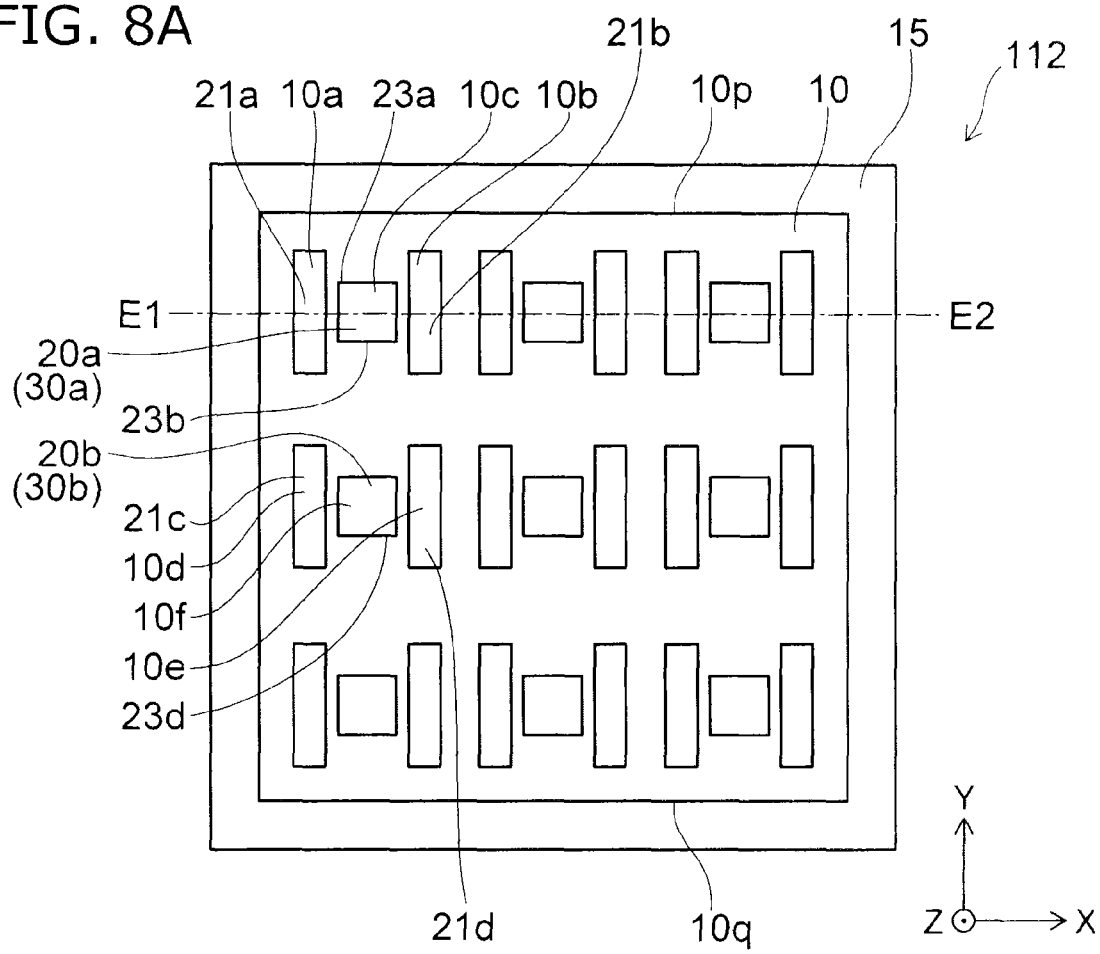
FIG. 8A and FIG. 8B are schematic views illustrating the semiconductor device according to the second embodiment.
Figure 8B:
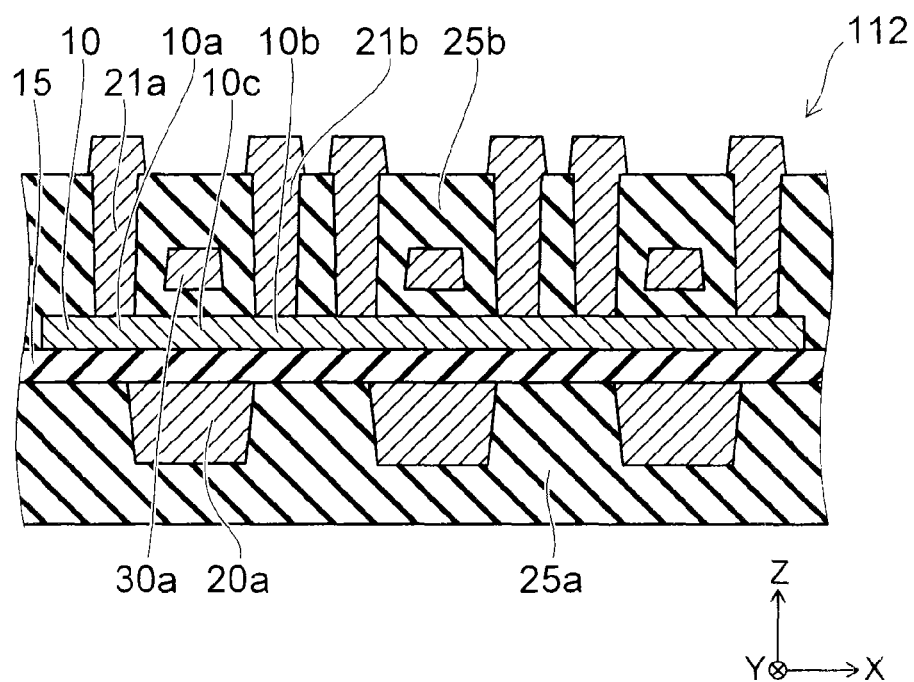

FIG. 8A and FIG. 8B are schematic views illustrating the semiconductor device according to the second embodiment.

FIG. 8A is a perspective plan view showing the semiconductor device according to the second embodiment.

FIG. 8B is a schematic cross-sectional view showing the semiconductor device according to the second embodiment. FIG. 8B is a cross-sectional view along line E1-E2 of FIG. 8A.

The semiconductor device 112 includes a first conductive unit 30a and a second conductive unit 30b. The first conductive unit 30a is provided on the first gate electrode 20a. The first conductive unit 30a is provided between the first electrode 21a and the second electrode 21b. The second conductive unit 30b is provided on the second gate electrode 20b. The second conductive unit 30b is provided between the third electrode 21c and the fourth electrode 21d. Otherwise, the configuration, the material, etc., are similar to those of the semiconductor device 110 according to the first embodiment.

The multiple thin film transistors that are provided in the semiconductor device 111 and the semiconductor device 112 include one semiconductor layer 10 that is provided to be continuous. According to the embodiment, a semiconductor device is provided in which the fluctuation of the characteristics is suppressed.

Third Embodiment

Figure 9:
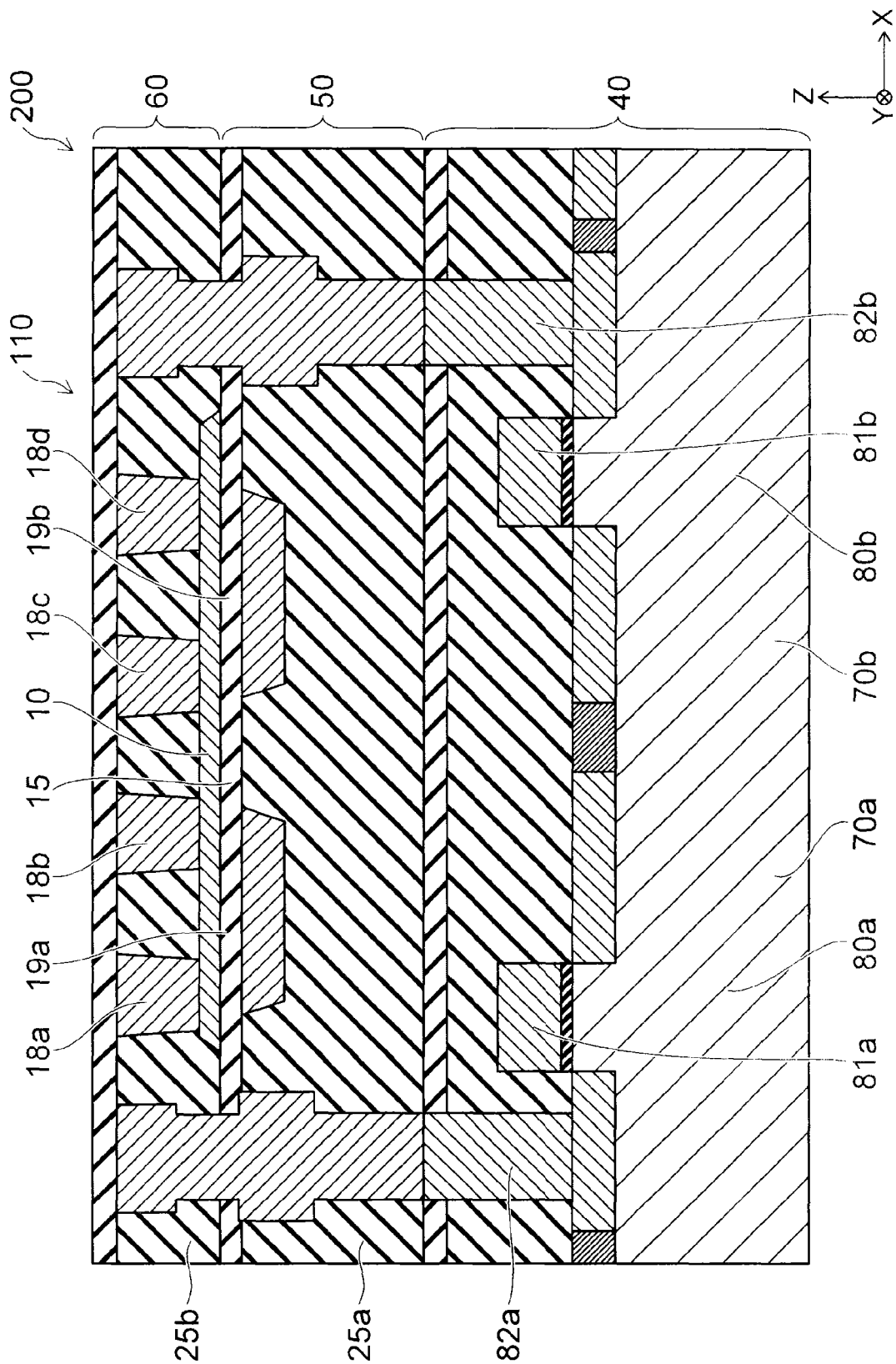
FIG. 9 is a schematic cross-sectional view illustrating an imaging device according to a third embodiment.

FIG. 9 is a schematic cross-sectional view illustrating an imaging device according to a third embodiment.

The imaging device 200 according to the third embodiment is a CMOS image sensor using a CMOS process.

FIG. 9 is a schematic cross-sectional view showing a portion of the imaging device 200. The imaging device 200 includes a semiconductor substrate layer 40, a first interconnect layer 50, and a second interconnect layer 60. The first interconnect layer 50 includes the first inter-layer insulating film 25a. The second interconnect layer 60 includes the second inter-layer insulating film 25b. Photodiodes (a first photodiode 70a and a second photodiode 70b) and transfer transistors (a first transfer transistor 81a and a second transfer transistor 81b) are provided in the semiconductor substrate layer 40. The first interconnect layer 50 is provided on the semiconductor substrate layer 40. The second interconnect layer 60 is provided on the first interconnect layer 50. The imaging device 200 includes, for example, the semiconductor device according to the first embodiment. The semiconductor device includes the semiconductor layer 10. For example, the semiconductor layer 10 is provided between the first inter-layer insulating film 25a and the second inter-layer insulating film 25b. The semiconductor device includes, for example, a first transistor 19a and a second transistor 19b. As shown in FIG. 9, the first transistor 19a and the second transistor 19b are provided in the interconnect layer.

The first transistor 19a includes a first electrode 18a and a second electrode 18b. The second transistor 19b includes a third electrode 18c and a fourth electrode 18d.

The imaging device 200 includes a first pixel unit 80a and a second pixel unit 80b. For example, the first pixel unit 80a and the second pixel unit 80b are adjacent pixel units when projected onto the X-Y plane. The first pixel unit 80a includes the first photodiode 70a, the first transfer transistor 81a, and a first interconnect 82a. The second pixel unit 80b includes the second photodiode 70b, the second transfer transistor 81b, and a second interconnect 82b.

The first transfer transistor 81a is provided on the first photodiode 70a. The first photodiode 70a is electrically connected to the first interconnect 82a via the first transfer transistor 81a. The first interconnect 82a is electrically connected to the first transistor 19a. The first interconnect 82a is electrically connected to the first electrode 18a or the second electrode 18b.

The second transfer transistor 81b is provided on the second photodiode 70b. The second photodiode 70b is electrically connected to the second interconnect 82b via the second transfer transistor 81b. The second interconnect 82b is electrically connected to the second transistor 19b. The second interconnect 82b is electrically connected to the third electrode 18c or the fourth electrode 18d.

The first transistor 19a processes the signal of the first pixel unit 80a. The first transistor 19a is, for example, an amplifier transistor of the first pixel unit 80a or a reset transistor of the first pixel unit 80a. The second transistor 19b processes the signal of the second pixel unit 80b. The second transistor 19b is, for example, an amplifier transistor of the second pixel unit 80b or a reset transistor of the second pixel unit 80b.

As shown in FIG. 9, the first transistor 19a and the second transistor 19b include one semiconductor layer 10 that is provided to be continuous. The first transistor 19a and the second transistor 19b share one semiconductor layer 10 that is provided to be continuous. Although two thin film transistors are shown in FIG. 9, the semiconductor device includes two or more thin film transistors.

In the imaging device 200 according to the embodiment, the thin film transistors are provided in the interconnect layer. Thereby, for example, the light reception surface area of the photodiodes can be increased. The multiple thin film transistors include one semiconductor layer 10 that is provided to be continuous. Thereby, the fluctuation of the thin film transistors can be suppressed. According to the embodiment, an imaging element is provided in which the fluctuation of the characteristics is suppressed.

According to the embodiments, a semiconductor device and an imaging device are provided in which the fluctuation of the characteristics is suppressed.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, embodiments of the invention are described with reference to specific examples. However, the invention is not limited to these specific examples. For example, one skilled in the art may similarly practice the invention by appropriately selecting specific configurations of components such as the semiconductor layer, the gate electrode, the insulating film, the electrode, etc., from known art; and such practice is within the scope of the invention to the extent that similar effects can be obtained.

Further, any two or more components of the specific examples may be combined within the extent of technical feasibility and are included in the scope of the invention to the extent that the purport of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:
   a semiconductor layer including
   a first semiconductor portion including a first portion, a second portion arranged with the first portion in a first direction, and a third portion provided between the first portion and the second portion, the third portion being continuous with the first portion and the second portion, and
   a second semiconductor portion being continuous with the first semiconductor portion, the second semiconductor portion including a fourth portion, a fifth portion, and a sixth portion, the fourth portion being arranged with the first portion in a second direction intersecting the first direction, the fifth portion being arranged with the second portion in the second direction, the sixth portion being provided between the fourth portion and the fifth portion, the sixth portion being continuous with the fourth portion and the fifth portion;
   a first gate electrode separated from the third portion in a third direction intersecting a plane including the first direction and the second direction;
   a second gate electrode separated from the sixth portion in the third direction and separated from the first gate electrode in the second direction;
   an insulating film provided at a first position between the first gate electrode and the semiconductor layer and at a second position between the second gate electrode and the semiconductor layer, the insulating film spreading continuously in a region between the first position and the second position;
   a first electrode separated from the first gate electrode, and separated from the second gate electrode, the first electrode being electrically connected to the first portion;
   a second electrode separated from the first gate electrode, separated from the second gate electrode, and separated from the first electrode, the second electrode being electrically connected to the second portion;
   a third electrode separated from the first gate electrode, separated from the second gate electrode, separated from the first electrode, and separated from the second electrode, the third electrode being electrically connected to the fourth portion; and
   a fourth electrode separated from the first gate electrode, separated from the second gate electrode, separated from the first electrode, separated from the second electrode, and separated from the third electrode, the fourth electrode being electrically connected to the fifth portion,
   wherein
   the third portion, the first gate electrode, the first electrode, and the second electrode serve as a first transistor, and
   the sixth portion, the second gate electrode, the third electrode, and the fourth electrode serve as a second transistor,
   the semiconductor layer has a first semiconductor side and a second semiconductor side,
   the second semiconductor side is arranged with the first semiconductor side in the second direction, the first gate electrode has a first gate side and a second gate side, the second gate side is provided between the first gate side and the second semiconductor side when projected onto the plane, the second gate side is arranged with the first gate side in the second direction, and a first distance along the second direction between the first semiconductor side and the first gate side is 0.3 micrometers or more.

2. The semiconductor device according to claim 1 wherein a distance along the second direction between the first semiconductor side and the first electrode is 0.8 times the first distance or more.

3. The semiconductor device according to claim 1, wherein a distance along the second direction between the first semiconductor side and the first electrode is 0.24 micrometers or more.

4. The semiconductor device according to claim 1, wherein the second gate electrode has a third gate side and a fourth gate side, the fourth gate side is arranged with the third gate side in the second direction, and the fourth gate side is provided between the third gate side and the second semiconductor side when projected onto the plane, and a second distance along the second direction between the second gate side and the third gate side is 0.5 micrometers or more.

5. The semiconductor device according to claim 4, wherein a distance along the second direction between the first electrode and the third electrode is 0.8 times the second distance or more.

6. The semiconductor device according to claim 1, wherein a distance along the second direction between the first electrode and the third electrode is 0.24 micrometers or more.

7. The semiconductor device according to claim 1, further comprising:

a semiconductor substrate; and a first inter-layer insulating film provided between the semiconductor substrate and the semiconductor layer.

8. The semiconductor device according to claim 7, wherein the first gate electrode is provided between the first inter-layer insulating film and the semiconductor layer.

9. The semiconductor device according to claim 1, wherein the first gate electrode is provided between the first electrode and the second electrode, and the second gate electrode is provided between the third electrode and the fourth electrode.

10. The semiconductor device according to claim 1, wherein the semiconductor layer includes an amorphous oxide semiconductor.

11. The semiconductor device according to claim 1, wherein the semiconductor layer includes an oxide, and the oxide includes oxygen, indium, and at least one selected from a group consisting of gallium and zinc.

12. The semiconductor device according to claim 1, wherein a thickness of the semiconductor layer is not less than 5 nanometers and not more than 100 nanometers.

13. The semiconductor device according to claim 1, wherein a thickness of the semiconductor layer is not less than 10 nanometers and not more than 50 nanometers.

14. The semiconductor device according to claim 1, wherein the first electrode includes at least one selected from a group consisting of molybdenum, titanium, aluminum, indium tin oxide, indium zinc oxide, titanium nitride, tantalum nitride, and molybdenum nitride.

15. An imaging device, comprising the semiconductor device according to claim 1.

16. The imaging device according to claim 15, further comprising:

a semiconductor substrate layer; and a first interconnect layer provided between the semiconductor substrate layer and the semiconductor layer.

17. The imaging device according to claim 16, wherein the semiconductor substrate layer includes a first photodiode and a first transfer transistor.

18. The imaging device according to claim 17, further comprising a first interconnect, the first photodiode being electrically connected to the first interconnect via the first transfer transistor, the first interconnect being electrically connected to the first electrode or the second electrode.

* * * * *